(12) United States Patent
Li et al.

(10) Patent No.: US 11,749,548 B2
(45) Date of Patent: Sep. 5, 2023

(54) TRANSPORT SYSTEM, ASSOCIATED MOVABLE CONTAINER AND METHOD

(71) Applicant: TAIWAN SEMICONDUCTOR MANUFACTURING COMPANY LTD., Hsinchu (TW)

(72) Inventors: Fu-Hsien Li, Taichung (TW); Chi-Feng Tung, Miaoli County (TW); Hsiang Yin Shen, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 188 days.

(21) Appl. No.: 17/321,184

(22) Filed: May 14, 2021

(65) Prior Publication Data

US 2021/0272831 A1    Sep. 2, 2021

Related U.S. Application Data

(63) Continuation of application No. 16/390,450, filed on Apr. 22, 2019, now Pat. No. 11,011,402.

(60) Provisional application No. 62/690,631, filed on Jun. 27, 2018.

(51) Int. Cl.
*G06F 7/00* (2006.01)
*H01L 21/677* (2006.01)

(52) U.S. Cl.
CPC .... *H01L 21/67724* (2013.01); *H01L 21/6773* (2013.01); *H01L 21/67709* (2013.01); *H01L 21/67733* (2013.01)

(58) Field of Classification Search
CPC ......... H01L 21/67724; H01L 21/67709; H01L 21/6773; H01L 21/67733; H01L 21/67276; H01L 21/67706
USPC .................................................. 700/213, 222
See application file for complete search history.

(56) References Cited

U.S. PATENT DOCUMENTS

| | | | | |
|---|---|---|---|---|
| 2012/0055751 | A1* | 3/2012 | Vollenwyder | B60L 5/005 |
| | | | | 191/10 |
| 2015/0061377 | A1* | 3/2015 | Ishikawa | B61C 3/02 |
| | | | | 307/9.1 |
| 2016/0114701 | A1* | 4/2016 | Heinen | B60M 7/003 |
| | | | | 191/2 |

FOREIGN PATENT DOCUMENTS

TW    I612007 B    1/2018

\* cited by examiner

*Primary Examiner* — Yolanda R Cumbess
(74) *Attorney, Agent, or Firm* — WPAT LAW; Anthony King

(57) ABSTRACT

A transport system, including: a sensor, a controller and a power panel. The sensor determines a zone and sends a quantity information in response to a quantity of vehicles in the zone. The controller is arranged to send an output signal in accordance with the quantity information. The power panel is arranged to output a current in accordance with the output signal for driving vehicles in the zone, wherein the current is outputted to a cable extending through the zone.

20 Claims, 9 Drawing Sheets

TRANSPORT SYSTEM, ASSOCIATED MOVABLE CONTAINER AND METHOD

CROSS-REFERENCE TO RELATED APPLICATION

This application is a continuation of U.S. application Ser. No. 16/390,450, filed on Apr. 22, 2019, which claims the benefit of U.S. Provisional Application No. 62/690,631, filed on Jun. 27, 2018, which are incorporated by reference in their entirety.

BACKGROUND

Automated Material Handling Systems (AMHS) have been widely used in semiconductor fabrication facilities ("FABS") to automatically handle and transport groups or lots of wafers between various processing machines ("tools") used in chip manufacturing. A typical FAB may include one or more floors having a plurality of process bays including processing tools and wafer staging equipment, which are interconnected by the AMHS.

Each bay may include a wafer stocker, which includes multiple bins for temporarily holding and staging a plurality of wafer carriers during the fabrication process. The wafer carriers may include standard mechanical interface (SMIF) pods which may hold a plurality of 200 mm (8 inch) wafers, or front opening unified pods (FOUPs) which may hold larger 300 mm (12 inch) wafers. Stockers generally include a single mast robotic lift or crane having a weight bearing capacity sufficient for lifting, inserting, and retrieving single wafer carriers one at a time from the bins. The stocker holds multiple SMIF pods or FOUPs in preparation for transporting a SMIF or FOUP to the loadport of a processing tool.

A semiconductor FAB may include numerous types of automated and manual vehicles for moving and transporting wafer carriers throughout the FAB during the manufacturing process. These may include, for example, automatic guided vehicles (AGVs), personal guided vehicles (PGVs), rail guided vehicles (RGVs), overhead shuttles (OHSs), and overhead hoist transports (OHTs). An OHT system automatically moves OHT "vehicles" that carry and transport wafer carriers, such as SMIF pods or FOUPs holding multiple wafers, from a processing or work tool or a stocker to the loadport of another tool or other apparatus in the FAB. The OHT system may be used to transport vehicles within each bay (intra-bay) or between bays (inter-bay). The OHT system also moves empty vehicles (i.e., vehicles without a wafer carrier) to the tool loadport or other apparatus for receiving and removing empty or full SMIF pods or FOUPs that may contain wafers for further transport and/or processing in other tools.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
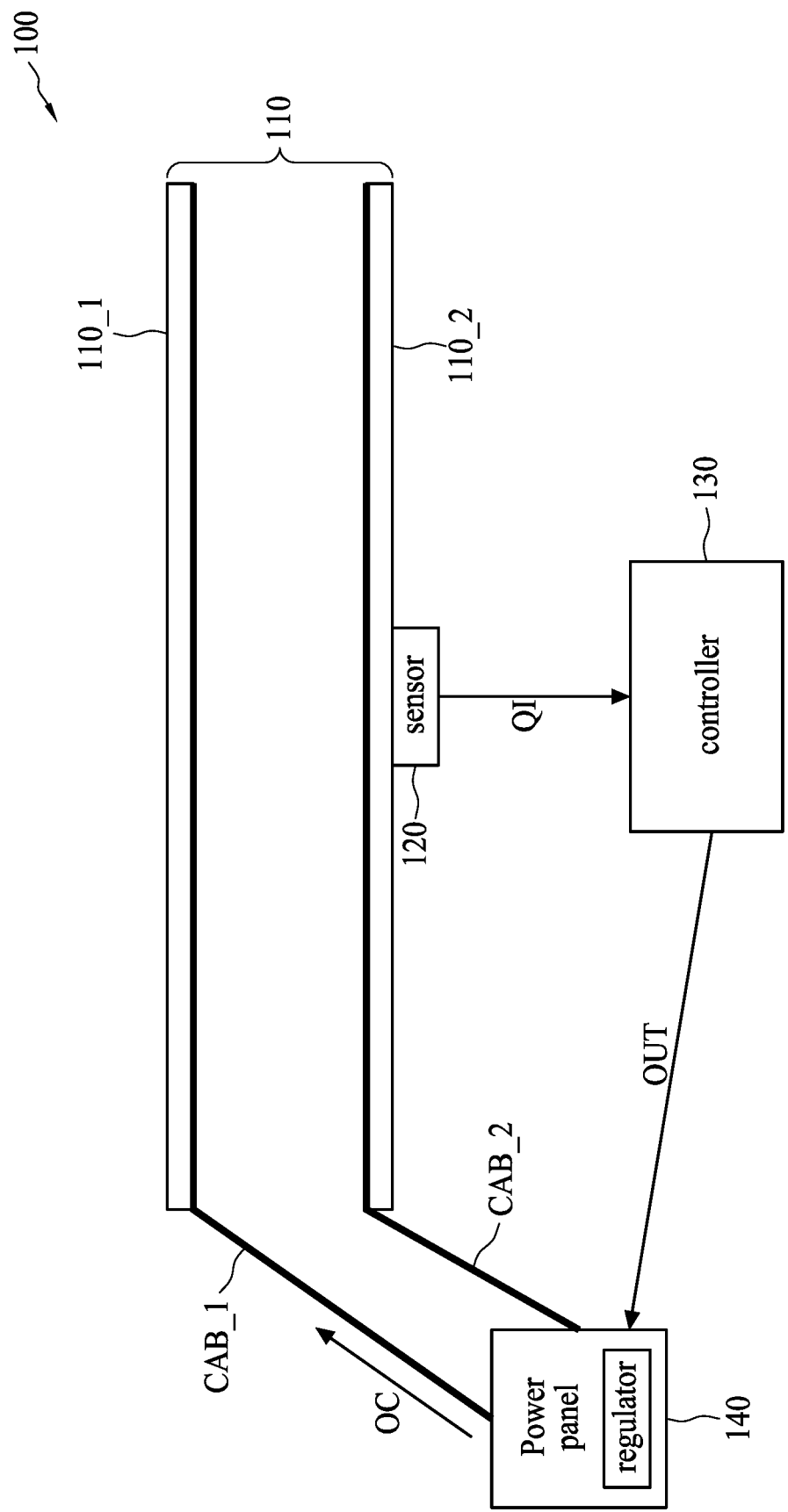
FIG. 1 is a diagram illustrating a transport system according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An Automated Material Handling System (AMHS) usually includes an overhead hoist transport (OHT) system, a stocker system and other involved facilities and equipment. The OHT system includes a noncontact power supply device including a rail, an induction cable extending along the rail and a power panel. The power panel converts the commercial power supply to a higher frequency, and output electrical power to the induction cable. The OHT system occupies about 50% of total power consumption of the AMHS. Even when the AMHS is idle, the OHT system still constantly consumes power.

FIG. 1 is a diagram illustrating a transport system 100 according to an embodiment of the present disclosure. In some embodiments, the transport system 100 is applied to a semiconductor fabrication facility. In this embodiment, the transport system 100 is a system applied to an AMHS in a semiconductor fabrication facility. For example, the transport system 100 can be an OHT system. It should be noted that, the transport system 100 may be a part of the AMHS applied to one of many floors in a semiconductor fabrication facility. The transport system 100 includes a rail 110 consisting of two sides 110_1 and 110_2, a sensor 120, a controller 130 and a power panel 140. The rail 110 carries vehicles, and the vehicles are for transporting products (e.g., semiconductor wafers). As mentioned above, the transport system 100 is a part of the AMHS. Therefore, the rail 110 shown in FIG. 1 can be seen as a section of the rail of the AMHS. It should be noted that, in another embodiment, the rail 110 is a monorail, and the type of the rail 110 should not be limited by the present disclosure.

The sensor 120 is installed on the rail 110, and the sensor 120 determines a zone of the rail 110. For example, the zone is determined by the sensing range of the sensor 120, and substantially equals to the length of the rail 110. With such configurations, the sensor 120 may be installed in the middle of the rail 110 to facilitate the sensing. However, this is not a limitation of the present disclosure. Alternative designs will be described in the paragraphs below. The sensor 120 senses the quantity of vehicles in the zone, i.e., on the rail 110, and sends the quantity information QI to the controller 130 in response to the quantity of vehicles in the zone. In this embodiment, the sensor 120 is implemented by an infrared sensor, a touch sensor, a light guide or a camera, etc., and the implementation of the sensor 120 should not be limited by the present disclosure.

The controller 130 receives the quantity information QI and sends an output signal OUT to the power panel 140 in accordance with the quantity of vehicles in the zone indicated by quantity information QI. In this embodiment, the transmission of the quantity information QI and the output signal OUT is done via Wireless Fidelity (Wi-Fi). In other words, the sensor 120, the controller 130 and the power panel 140 communicates via Wi-Fi, however, this is not a limitation of the present disclosure. The power panel 140 adjusts an output current OC in accordance with the output signal OUT, and outputs the output current OC to the rail 110 via induction cables CAB_1 and CAB_2 corresponding to two sides of the rail (i.e., 110_1 and 110_2), respectively.

In this embodiment, the controller 130 may be implemented by a computer. However, in another embodiment, the controller 130 is implemented by a server or any electronic device with computing power. These alternative designs should fall within the scope of the present disclosure as long as the controller 130 can transfer the information indicating the quantity of vehicles in the zone from the sensor 120 to the power panel 140.

In this embodiment, the output signal OUT may directly indicate the quantity of vehicles in the zone, and the power panel 140 transfers the quantity of vehicles in the zone into the required output current OC. In other embodiments, the output signal OUT indicates the required current corresponding to the quantity of vehicles in the zone, and the power panel 140 outputs the output current OC in accordance with the output signal OUT.

The power panel 140 converts the commercial power supply to a frequency suitable for noncontact power supply, and feeds the power (i.e., the output current OC) to the induction cable CAB. For example, the power panel 140 convers the frequency of the commercial power supply (i.e., 60 Hz) to about 8660 Hz. The induction cable CAB is an electric line installed along the rail 110 as shown in FIG. 1. When the output current OC passing through the induction cable CAB, a magnetic field is generated around the cable to wirelessly providing electric power.

Specifically, when the output signal OUT indicates that there is no vehicle in the zone, the power panel 140 stops outputting or reduces the output current OC to the induction cable CAB. In addition, the power panel 140 may stop converting the commercial power supply to a higher frequency in order to save power. When the output signal OUT indicates that there is only one vehicle on the rail 110, the power panel 140 outputs the output current OC whose magnitude can be represented as A to the induction cable CAB. When the output signal OUT indicates that there are two vehicles on the rail 110, the power panel 140 outputs the output current OC whose magnitude can be represented as 2A to the induction cable CAB. However, the relationship of the magnitude of the output current OC and the quantity of vehicles in the zone are not limited to be proportional. In other embodiments, the output current OC outputted by the power panel 140 and the quantity of vehicles in the zone are positive correlated. For example, when the output signal OUT indicates that there is only one vehicle on the rail 110, the power panel 140 outputs the output current OC whose magnitude can be represented as A to the induction cable CAB. When the output signal OUT indicates that there are two vehicles on the rail 110, the power panel 140 outputs the output current OC whose magnitude may be 1.5 A to the induction cable CAB. The magnitude of the output current OC being adjusted in accordance with the quantity of vehicles in the zone is only for illustrative purpose, and it should not be limited by the present disclosure. In addition, the adjustment of the output current OC may be implemented by a current regulator in the power panel 140.

Figure 2A:
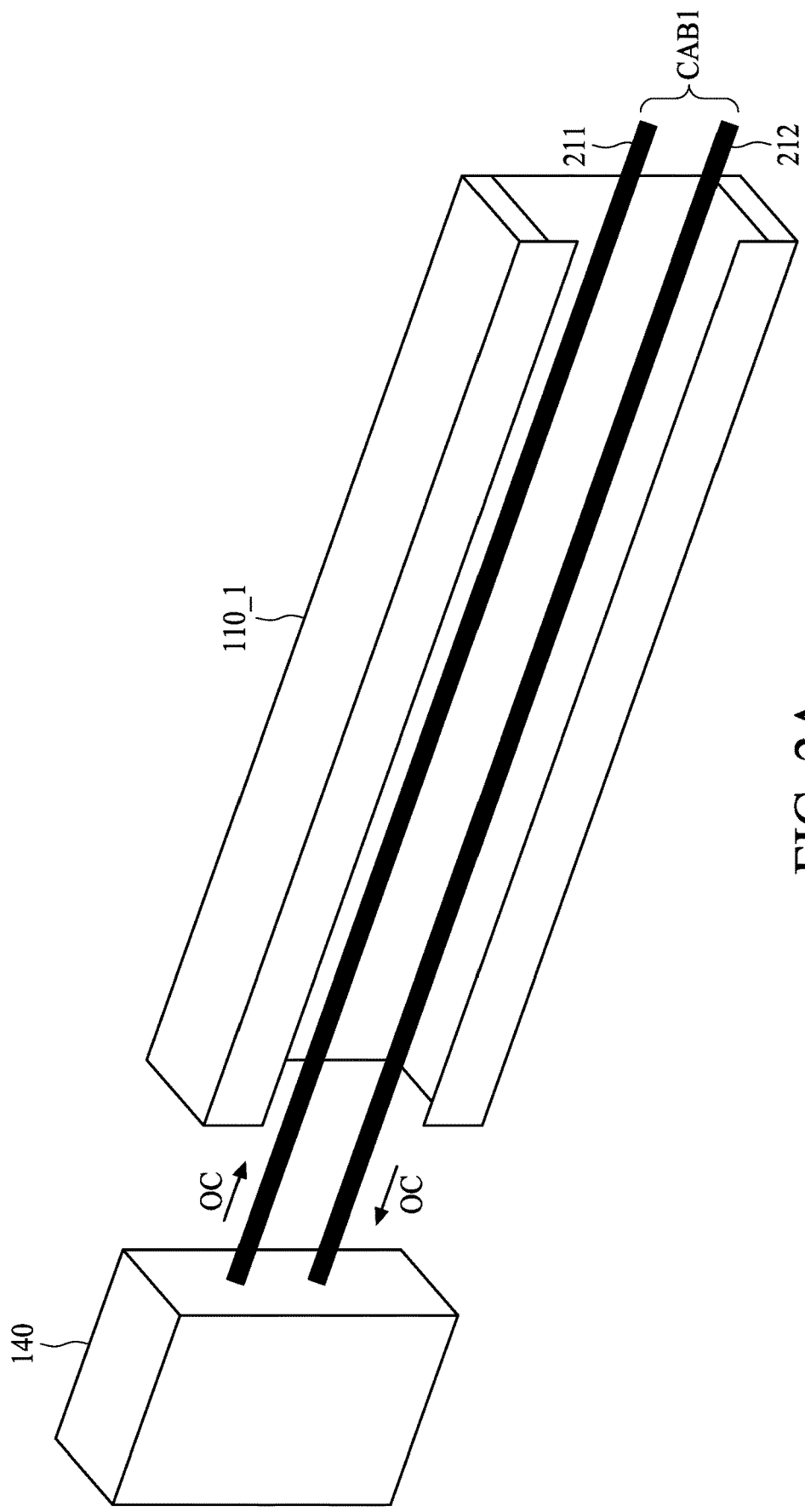
FIG. 2A to FIG. 2B are diagrams illustrating a rail, a power panel and a cable extending along the rail of a transport system according to an embodiment of the present disclosure.
Figure 2B:
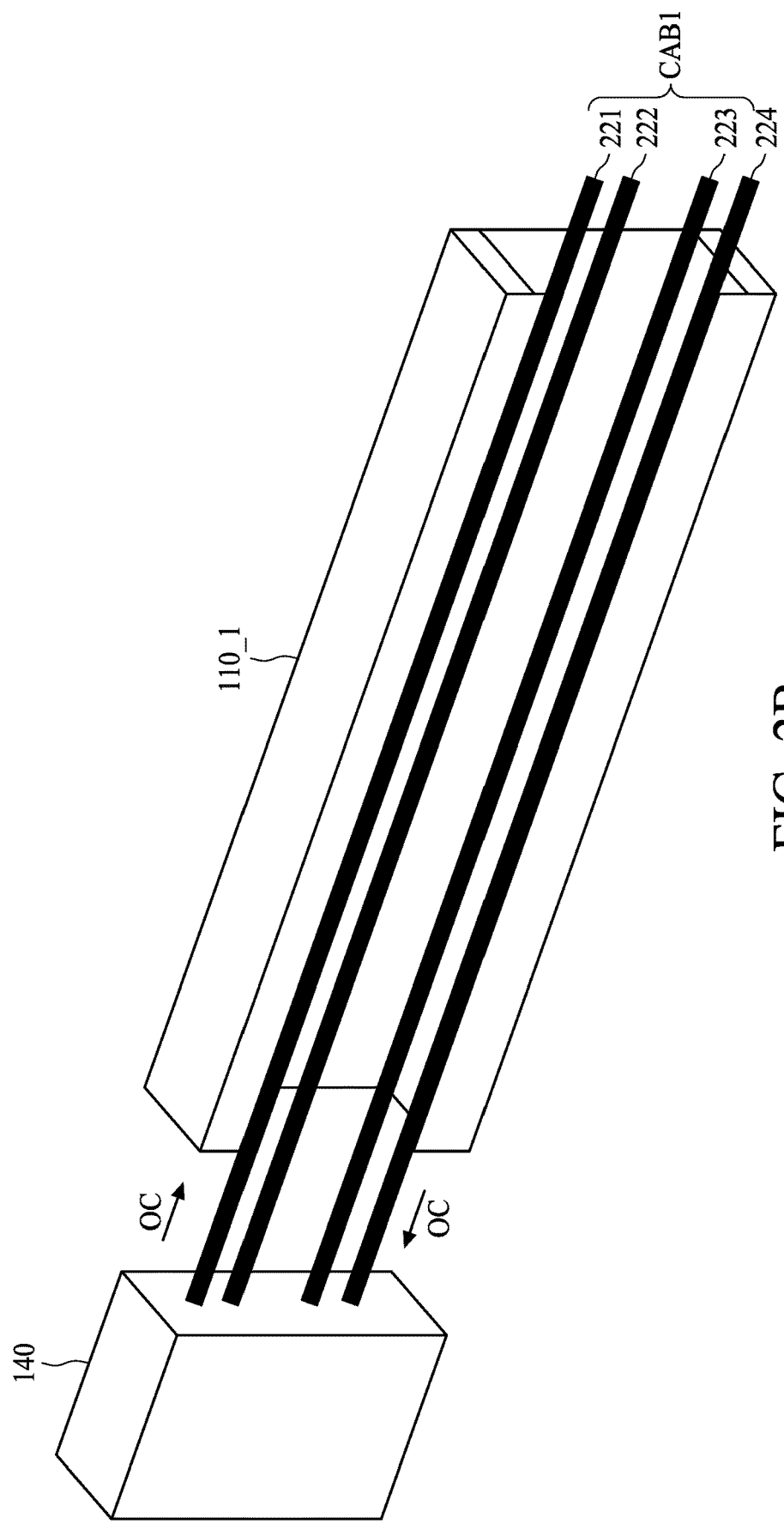

It should be noted that, in FIG. 1, only one cable (i.e., CAB_1 or CAB_2) is depicted along one side (i.e., 110_1 or 110_2) of the rail 110. However, in other embodiments, there are more than one cable go along one side of rail 110. FIG. 2A to FIG. 2B are diagrams illustrating the rail 110, the power panel 140 and the induction cable CAB_1 extending along one side of the rail 110 according to an embodiment of the present disclosure. As shown in FIG. 2A, the induction cable CAB_1 consists of two lines 211 and 212, and each line carries the output current OC from the power panel 140. The line 211 extends along one side 110_1 of the rail 100 on the top, while the line 212 extends along one side 110_1 of rail 110 at the bottom. It should be noted that, the output current OC on the lines 211 and 212 may flow in different directions to generate a stronger magnetic field according to Ampere's law for the equipment disposed between the lines 211 and 212.

In order to maintain the function of the transport system 100 and also reduce the power consumption as much as possible, in one embodiment, the unit resistance of lines 211 and 222 is about 5-6 ohm/meter, and the output current OC is about 63-65 ampere.

As shown in FIG. 2B, the induction cable CAB_1 consists of four lines 221, 222, 223 and 224, and each line carries the output current OC from the power panel 140. The lines 221 and 222 form a pair extending along one side 110_1 of the rail 110 on the top, while the lines 223 and 224 form a pair extending along one side 110_1 of the rail 110 at the bottom. It should be noted that, the output current OC on the pair consisting of lines 221 and 222 and the pair consisting of lines 223 and 224 may flow in different directions to generate a stronger magnetic field according to Ampere's law for the equipment disposed between the lines 221 to 224.

In order to maintain the function of the transport system 100 and also reduce the power consumption as much as possible, in one embodiment, the unit resistance of lines 221 to 224 is about 3.5-4 ohm/meter, and the output current OC is less than 63 ampere. Comparing to the embodiment of FIG. 2A, the embodiment of FIG. 2B can reduce about 20-25% of power consumption under the same condition.

Figure 3A:
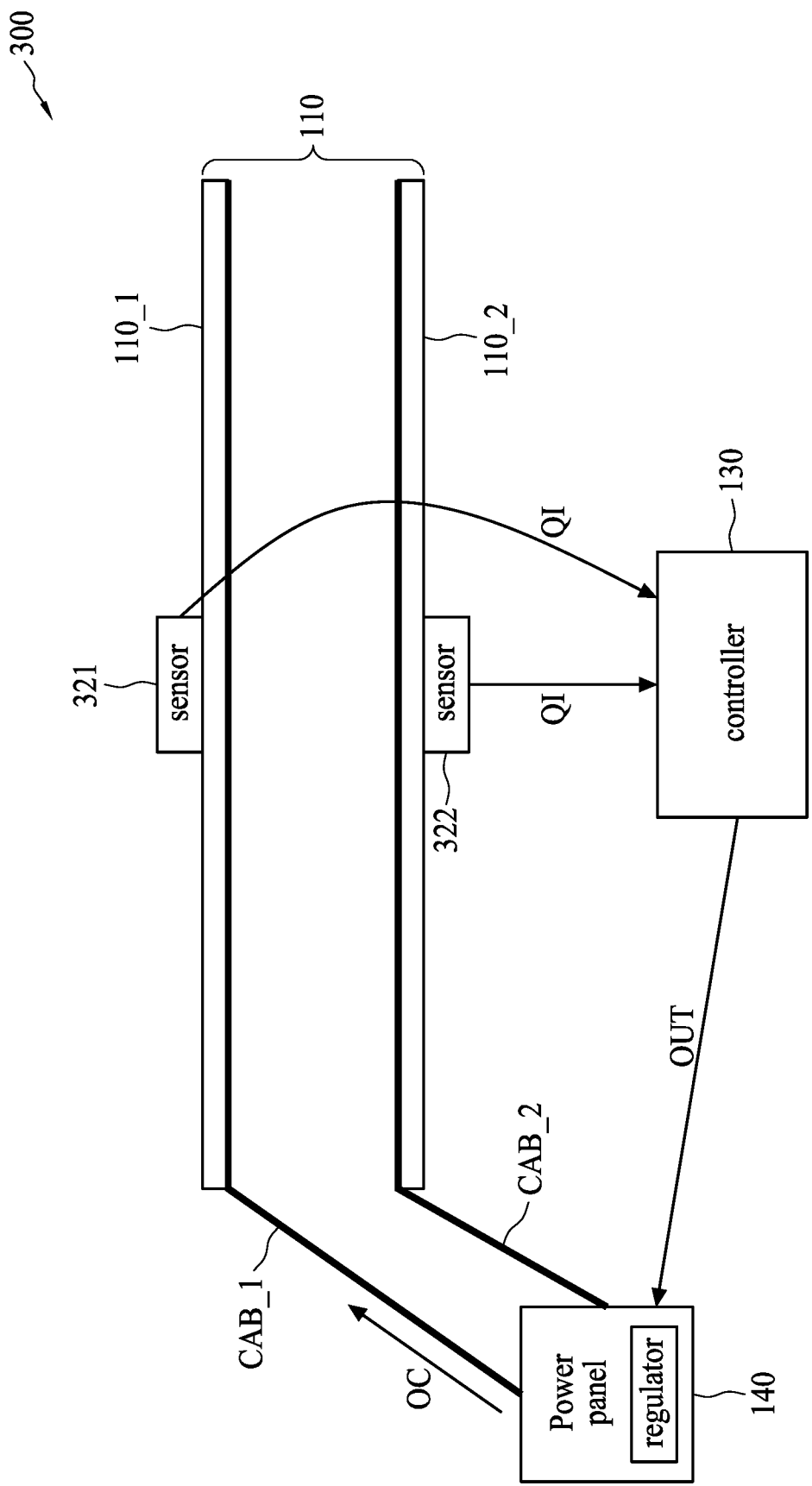
FIGS. 3A to 3C are diagrams illustrating a transport system according to another embodiment of the present disclosure.

In the embodiment of FIG. 1, the sensor 120 determines the zone by the sensing range thereof. With such configurations, the sensor 120 may be installed in the middle of the rail 110 to sense the quantity of vehicle in the zone. However, this is not a limitation of the present disclosure. Refer to FIG. 3A, which is a diagram illustrating a transport system 300 according to another embodiment of the present disclosure. The transport system 300 is similar to the transport system 100 described and illustrated with reference to FIG. 1 except the sensors 321 and 322. In this embodiment, the sensors 321 and 322 are oppositely located in the middle of the rail 110 to sense the quantity of vehicles in the zone, and each sensor sends the quantity information QI to the controller 130. With such configurations, the zone is determined by the sensing range of the sensors 321 and 322. However, it is only for illustrative purpose, the locations of the sensors should not be limited by the embodiments of FIG. 1 and FIG. 3A.

Figure 3B:
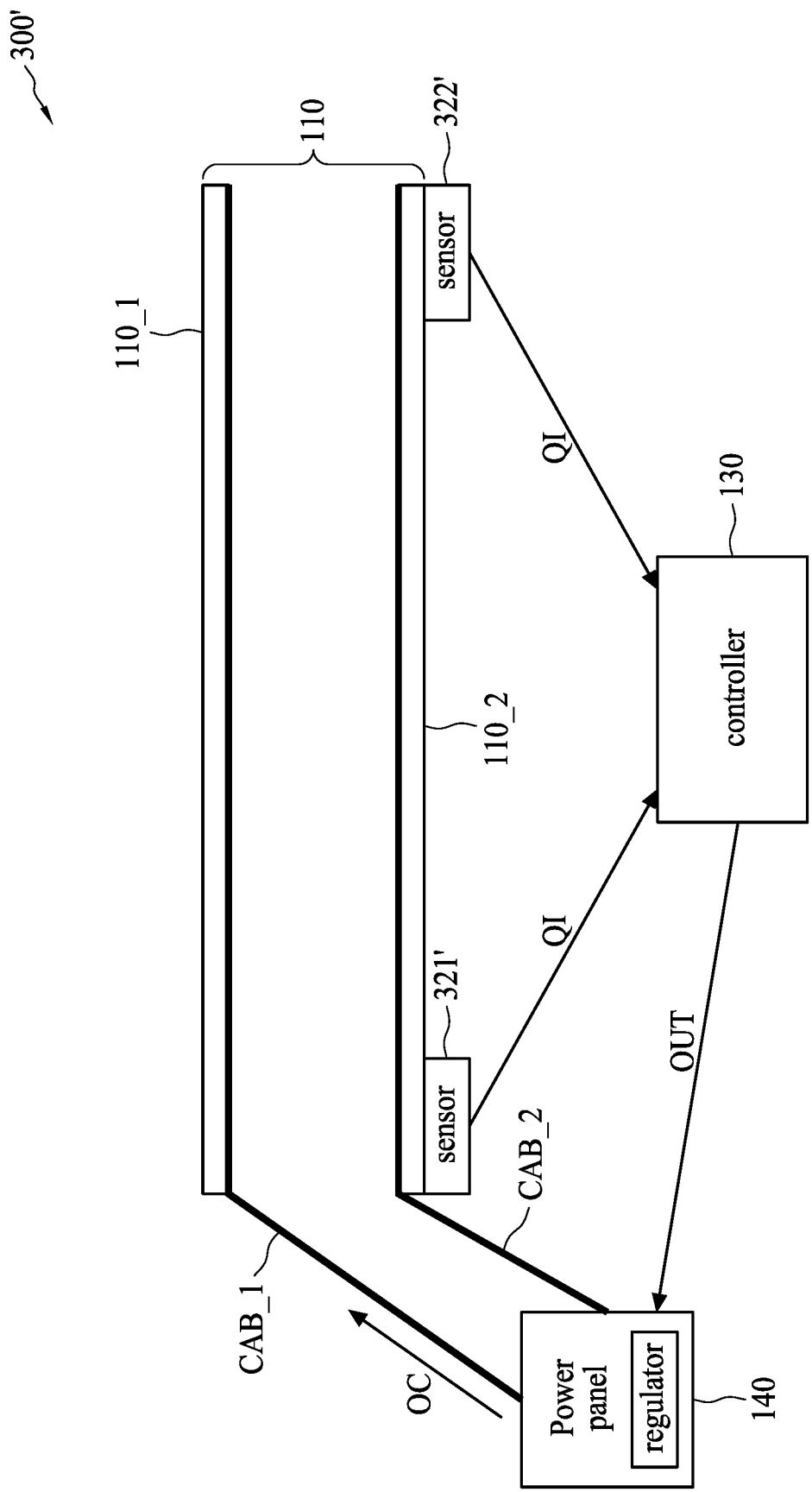

Refer to FIG. 3B, which is a diagram illustrating a transport system 300' according to another embodiment of the present disclosure. The transport system 300' is similar to the transport system 100 described and illustrated with reference to FIG. 3A except the sensors 321' and 322'. In this embodiment, the sensors 321' and 322' are respectively located at the entrance and the exit of the rail 110 to sense the quantity of vehicles in the zone, and each sensor sends the quantity information QI to the controller 130. With such configurations, the zone is determined by the distance between the sensors 321' and 322'. However, it is only for illustrative purpose, the locations of the sensors should not be limited by the embodiments of FIG. 1 and FIGS. 3A to 3B.

Figure 3C:
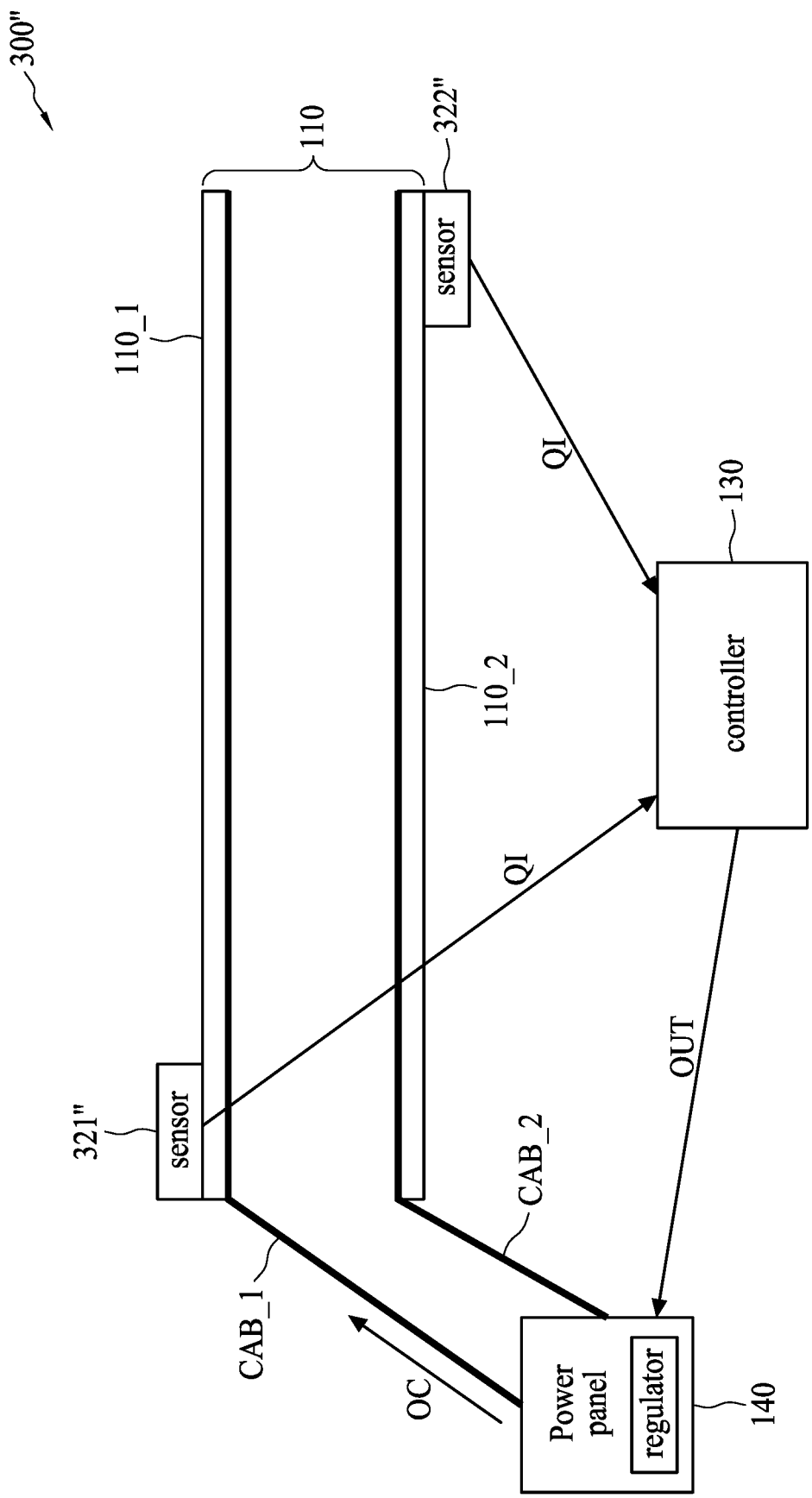

Refer to FIG. 3C, which is a diagram illustrating a transport system 300' according to yet another embodiment of the present disclosure. The transport system 300" is similar to the transport system 300' described and illustrated with reference to FIG. 3B except the sensors 321" and 322". In this embodiment, the sensors 321' and 322' are respectively located at the entrance and the exit of the rail 110, but on the different side of the rail 110 to sense the quantity of vehicles in the zone, and each sensor sends the quantity information QI to the controller 130. With such configurations, the zone is determined as mentioned in the embodiment of FIG. 3B. Those skilled in the art should readily understand that the locations of the sensors should not be limited by the embodiments of FIGS. 1, and 3A-3C. In other embodiments, the zone can be easily defined by the length of the rail 110.

Figure 4:
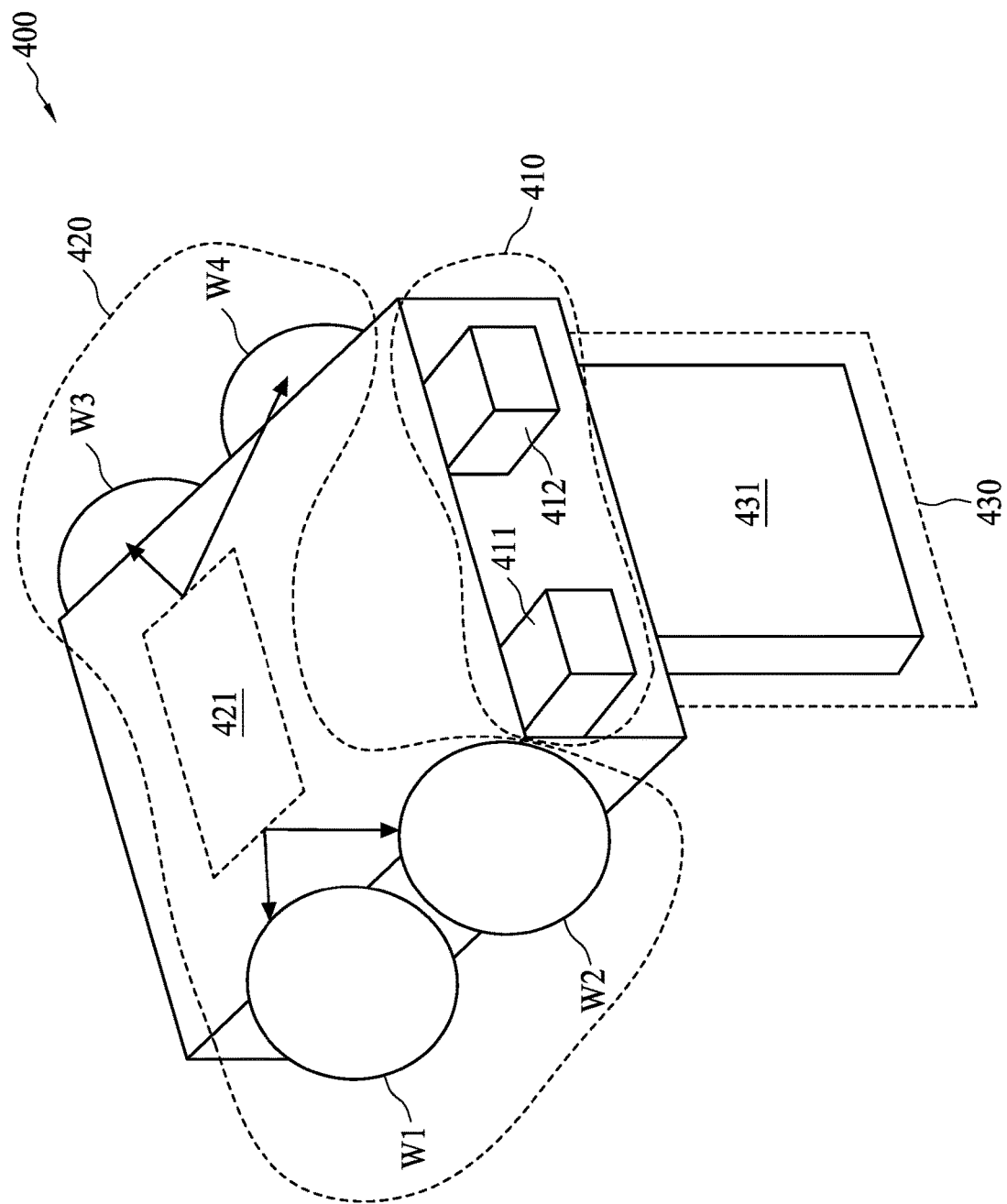
FIG. 4 is a diagram illustrating a movable container according to an embodiment of the present disclosure.

FIG. 4 is a diagram illustrating a movable container 400 according to an embodiment of the present disclosure. In this embodiment, the movable container 400 can be adapted to a vehicle carried by the rail 110, and the movable container 400 coordinates with the transport system 100 or 300 shown above. The movable container 400 includes a power transferring mechanism 410, a driving mechanism 420 and a back-up power mechanism 430. The power transferring mechanism 410 including pickup coils 411 and 412, and each pickup coil transfers the magnetic field generated from the output current OC on the induction cable CAB into electric power. It should be noted that the locations of the power transferring mechanism 410, the driving mechanism 420 and the back-up power mechanism 430 are only for illustrative, and it should not be limited by the present disclosure. In some embodiments, the power transferring mechanism 410 may be installed on the side of the movable container 400 to sense the magnetic field generated by the induction cable CAB in accordance with the output current OC.

Figure 5B:
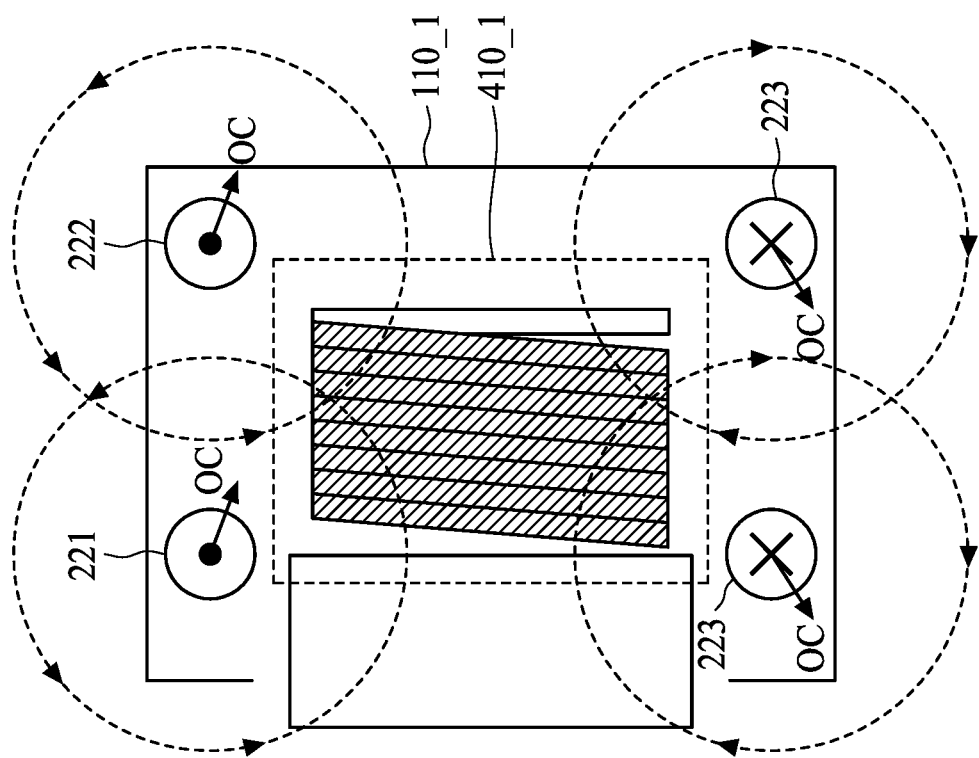
FIGS. 5A and 5B are diagrams illustrating a pickup coil transferring magnetic field into electrical power according to an embodiment of the present disclosure.
Figure 5A:
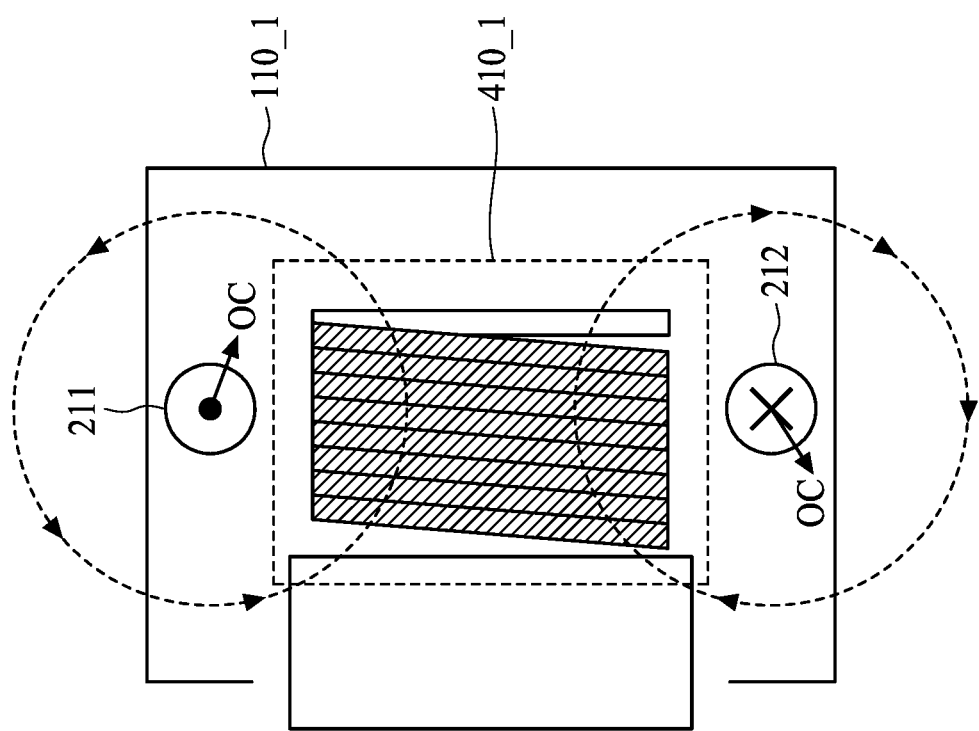

Refer to FIG. 5A and FIG. 5B, which are diagrams illustrating a pickup coil transferring magnetic field generated from the output current OC according to an embodiment of the present disclosure. As shown in FIG. 5A, the direction of the output current OC passing through the line 211 is out of the paper, and the output current OC generates a counter-clockwise magnetic field according to Ampere's law. The counter-clockwise magnetic field passes through the pickup coil 410_1. On the other hand, the direction of the output current OC passing through the line 212 is toward the paper, and the output current OC generates a clockwise magnetic field according to Ampere's law. The clockwise magnetic field passes through the pickup coil 4101. The pickup coil 410_1 transfers the magnetic fields sensed thereby into electrical power. More specifically, the magnetic fields generated by the lines 211 and 212 are sensed by the pickup coil 410_1. According to Faraday's law, the magnetic fields interact with the pickup coil 4101 to produce an electromotive force to the driving mechanism 420.

As shown in FIG. 5B, the direction of the output current OC passing through the lines 221 and 222 is out of the paper, and the output current OC generates counter-clockwise magnetic fields in accordance with Ampere's law. The counter-clockwise magnetic fields pass through the pickup coil 410_1. On the other hand, the direction of the output current OC passing through the lines 223 and 224 is toward the paper, and the output current OC generates clockwise magnetic fields in accordance with Ampere's law. The clockwise magnetic fields pass through the pickup coil 410_1. The pickup coil 410_1 transfers the magnetic fields sensed thereby into electrical power. More specifically, the magnetic fields generated by the lines 221 to 224 are sensed by the pickup coil 410_1. According to Faraday's law, the magnetic fields interact with the pickup coil 4101 to produce an electromotive force to the driving mechanism 420.

Referring back to FIG. 4, the driving mechanism 420 receives the electrical power from the power transferring mechanism 410, and provides a momentum to the movable container 400 to generate a displacement according to the received electrical power. Specifically, the driving mechanism 420 includes a power receiving device 421 and wheels W1 to W4, wherein the power receiving device 421 receives the electrical power from the power transferring mechanism 410, and drives the wheels W1 to W4 with the electrical power. It should be noted that, the movable container 400 is not limited to include wheels W1 to W4. In other words, the movable container 400 may be driven by different driving mechanism. For example, the movable container 400 may include a magnetic levitation mechanism or other tools to generate a displacement in the zone in accordance with the electrical power from the power transferring mechanism 410.

The back-up power mechanism 430 is arranged to provide a back-up power at least to the driving mechanism 420 when a back-up mode is initiated, and being charged when a charging mode is initiated. Specifically, the back-up power mechanism 430 includes an energy storing device 431 arranged to execute the charging and discharging operation. In this embodiment, the energy storing device 431 is implemented by a capacitor.

In some embodiments, the back-up power mechanism 430 provides back-up power to facilitate operations which may not be smoothly achieved with the output current OC only. For example, when the output signal OUT indicating the quantity of vehicles in the zone is received, the power panel 140 adjusts the output current OC to maintain the function of the transport system 100 or 300. The power panel 140 provides enough output current OC to each vehicle to prevent each vehicle from slowing down and delaying the manufacturing schedule of the semiconductor fabrication facility. However, the transmission speed of the quantity information QI and the output signal OUT, or the processing speed of the sensor 120 and the controller 130, may not be fast enough to catch the variation of the quantity of vehicle in the zone. For example, the output signal OUT indicates that there is only one vehicle in the zone and the output current OC is generated for that one vehicle to cruise at a required speed. When another vehicle enters the same zone, ideally, the output current OC should be adjusted in order to supply two vehicles. However, there is a possibility that the power panel 140 is unable to simultaneously readjust the output current OC in accordance with the vehicle quantity change if signal lag occurs. Therefore, the two vehicles have to share the output current OC only designated for one vehicle. Lacking adequate output current for two vehicles keeps the two vehicles from maintaining the required speed. In this way, the back-up power mechanism 430 is kicked off to (more specifically, the energy storing device 431) provide a back-up power to the driving mechanism 420 in order to maintain the required speed.

For another example, when the movable container 400 executes a loading/unloading operation, the output current OC provided by the power panel 140 may be lower than a desired value. The loading/unloading operation may fail due to insufficient output current OC hence delaying the manufacturing schedule of the semiconductor fabrication facility. Therefore, to facilitate the loading/unloading operation, the back-up power mechanism 430 (more specifically, the energy storing device 431) provides the back-up power to the driving mechanism 420 to make sure the loading/unloading operation can succeed.

For yet another example, when the output current OC is not enough to accelerate the movable container 400, the back-up power mechanism 430 (more specifically, the energy storing device 431) provides supplemental power to the driving mechanism 420 to increase the momentum and accelerate the movable container 400.

In some embodiments, the back-up power mechanism 430 (more particularly, the energy storing device 431) is chargeable. For example, when the movable container 400 stays in the idle state, the back-up power mechanism 430 (more specifically, the energy storing device 431) receives the output current OC from the induction cable CAB to charge the energy storing device 431. For another example, when the movable container 400 slows down, that is, the momentum provided by the driving mechanism 420 gradually decreases, the back-up power mechanism 430 (more specifically, the energy storing device 431) receives the output current OC from the induction cable CAB to charge the energy storing device 431. For yet another example, when the power transferring mechanism 410 provides a stable electrical power reaching a predetermined value to the driving mechanism 420, and the driving mechanism 420 provides a stable momentum to the movable container 400 to maintain a required speed, the back-up power mechanism 430 (more specifically, the energy storing device 431) receives the output current OC from the induction cable CAB to charge the energy storing device 431.

Figure 6:
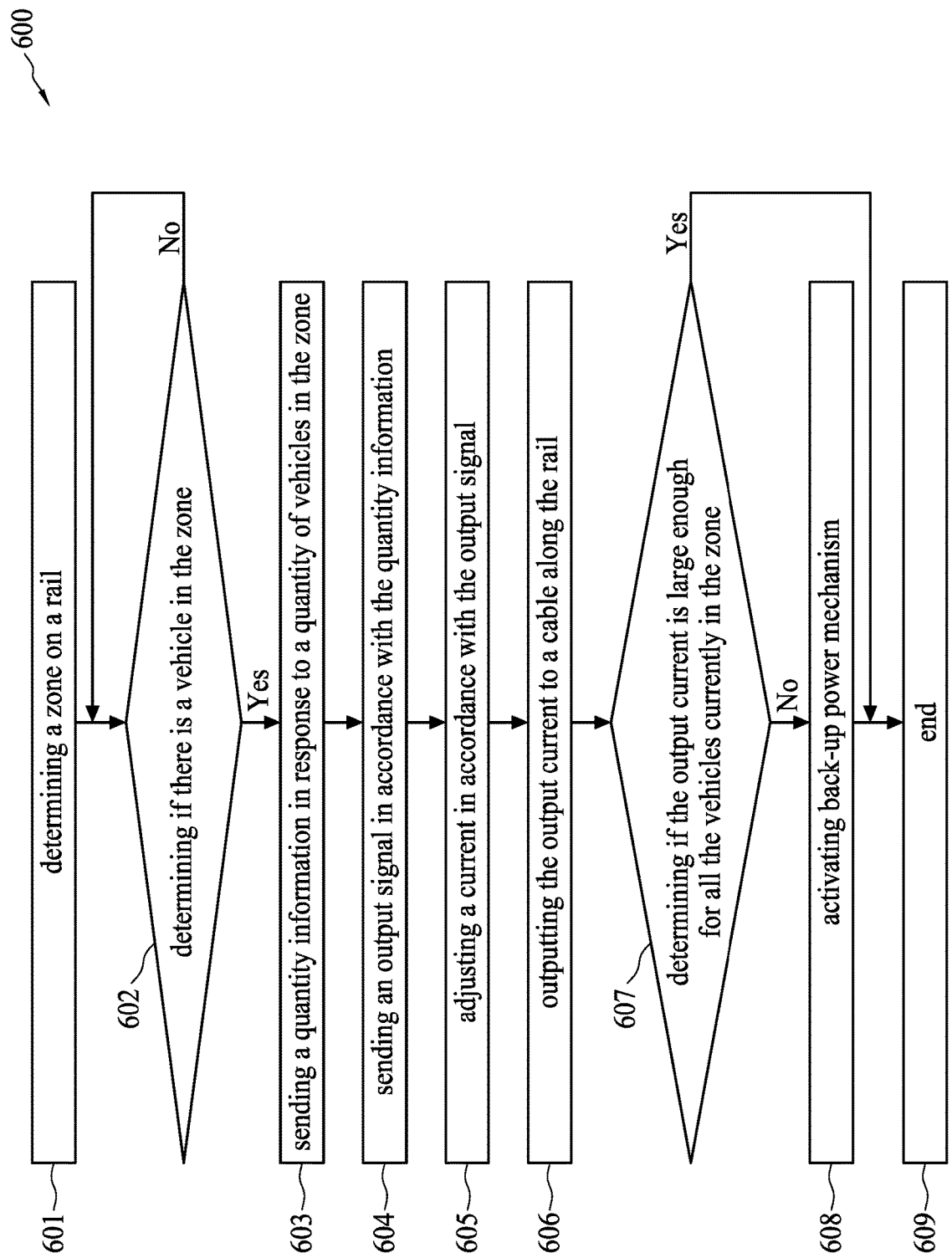
FIG. 6 is a flowchart illustrating a transport method according to an embodiment of the present disclosure.

FIG. 6 is a flowchart illustrating a transport method 600 according to an embodiment of the present disclosure. Provided that the result is substantially the same, the steps shown in FIG. 6 are not required to be executed in the exact order. The transport method 600 is summarized as below.

In step 601, a zone is determined on a rail.

In an embodiment, the sensor 120 determines a zone in accordance with the sensing range of the sensor 120. In another embodiment, the sensors 321 and 322 determine the zone by the distance between them, wherein the sensors 321 and 322 are disposed at the entrance and the exit of the rail 110, respectively. The zone may be defined by the length of the rail 110.

In step 602, determine if there is a vehicle in the zone, if yes, go to step 603; otherwise, go to step 602.

In step 603, a quantity information is sent in response to a quantity of vehicles in the zone.

In an embodiment, the sensor 120 sends the quantity information QI indicating the quantity of vehicle in the zone to the controller 130. To accurately calculate the quantity of vehicles in the zone, the sensor 120 may be implemented by an infrared sensor, a touch sensor, a light guide or a camera, etc.

In step 604, an output signal is sent in accordance with the quantity information.

In an embodiment, the controller 130, as a communication intermedium between the sensor 120 and the power panel 140, receives the quantity information QI indicating the quantity of vehicle in the zone, and sends the output signal OUT in accordance with the quantity information QL The output signal OUT may directly indicate the quantity of vehicles in the zone or indicate the required output current according to the quantity of vehicles in the zone. The controller 130 may be implemented by a personal computer, a laptop, a server, or any electronic device with computing power.

In step 605, a current is adjusted in accordance with the output signal.

In an embodiment, the power panel 140 receives the output signal OUT, and adjusts the output current OC in accordance with the output signal OUT. The adjustment of the output current OC may be done by a current regulator installed within the power panel 140.

In step 606, the output current is outputted to a cable along the rail.

In an embodiment, the power panel 140 outputs the output current OC to the induction cable CAB extending along the rail 110, wherein to achieve the noncontact power supply, the power panel 140 converts the commercial power supply into a higher frequency.

In step 607, determine if the output current is large enough for all vehicles currently in the zone to remain a required speed, execute predetermined operation or accelerate, if yes, go to step 609; otherwise, go to step 608.

When the output signal OUT indicating the quantity of vehicles in the zone is received, the power panel 140 adjusts the output current OC to maintain the function of the transport system 100 or 300. The power panel 140 provides enough output current OC to each vehicle to prevent each vehicle from slowing down and delaying the manufacturing schedule of the semiconductor fabrication facility. However, the transmission speed of the quantity information QI and the output signal OUT, or the processing speed of the sensor 120 and the controller 130, may not be fast enough to catch the variation of the quantity of vehicle in the zone. For example, the output signal OUT indicates that there is only one vehicle in the zone and the output current OC is generated for that one vehicle to cruise at a required speed. When another vehicle enters the same zone, ideally, the output current OC should be adjusted in order to supply two vehicles. However, there is a possibility that the power panel 140 is unable to simultaneously readjust the output current OC in accordance with the vehicle quantity change if signal lag occurs. Therefore, the two vehicles have to share the output current OC only designated for one vehicle. Lacking adequate output current for two vehicles keeps the two vehicles from maintaining the required speed.

When the movable container 400 executes a loading/unloading operation, the output current OC provided by the power panel 140 may be lower than a desired value. The loading/unloading operation may fail due to insufficient output current OC hence delaying the manufacturing schedule of the semiconductor fabrication facility.

When the output current OC is not enough to accelerate the movable container 400, the back-up power mechanism 430 (more specifically, the energy storing device 431) provides supplemental power to the driving mechanism 420 to increase the momentum and accelerate the movable container 400.

In the light of above, to maintain the required speed, facilitate the loading/unloading operation or accelerate the movable container 400, the back-up power mechanism 430 (more specifically, the energy storing device 431) is required to be activated to provide the back-up power to the driving mechanism 420.

In step 608, a back-up power mechanism is activated.

In step 609, the method is ended.

Those skilled in the art should readily understand the transport method 600 after reading the embodiments described above. The detailed description is omitted here.

In some embodiments, a transport system is disclosed. The transport system includes a sensor, a controller and a power panel. The sensor determines a zone and sends a quantity information in response to a quantity of vehicles in the zone. The controller is arranged to send an output signal in accordance with the quantity information. The power panel is arranged to output a current in accordance with the output signal for driving vehicles in the zone, wherein the current is outputted to a cable extending through the zone.

In some embodiments, a movable container is disclosed. The movable container includes a power transferring mechanism and a back-up power mechanism. The power transferring mechanism includes a pickup coil arranged to transfer a magnetic field generated from a current on a cable extending along a rail to a driving power to drive the movable container. The back-up power mechanism is arranged to provide a back-up driving power to drive the movable container when the driving power is insufficient to support the movable container to finish operations.

In some embodiments, a transport method is disclosed, including: sending a quantity information indicative of a quantity of vehicles in a zone; sending an output signal in accordance with the quantity information; adjusting a current in accordance with the output signal; and outputting the adjusted current to a cable extending through the zone.

What is claimed is:

1. A transport system, comprising:
    a sensor, wherein the sensor determines a zone, detects a quantity of vehicles in the zone, and sends a quantity information;
    a controller, arranged to send an output signal in accordance with the quantity information; and
    a power panel, arranged to output a current in accordance with the output signal for driving vehicles in the zone, wherein the current is outputted to a cable extending through the zone.

2. The transport system of claim 1, further comprising:
    a rail for carrying the vehicles, wherein the sensor is installed on the rail.

3. The transport system of claim 2, wherein the power panel stops outputting or reduces the current when the output signal indicates that no vehicle is on the rail.

4. The transport system of claim 1, wherein the current and the quantity of vehicles in the zone are positively correlated.

5. The transport system of claim 1, wherein communication between the sensor, the controller and the power panel is performed via Wireless Fidelity (Wi-Fi).

6. A movable container of a semiconductor fabrication facility, comprising:
    a power transferring mechanism, comprising a pickup coil arranged to transfer a magnetic field generated from a current on a cable extending along a rail to a driving power to drive the movable container;
    a back-up power mechanism, arranged to provide a back-up driving power to drive the movable container when the driving power is insufficient to support the movable container to finish operations of transporting semiconductor wafer in the semiconductor fabrication facility.

7. The movable container of claim 6, further comprising:
    a driving mechanism, arranged to provide a momentum to the movable container for generating a displacement on the rail.

8. The movable container of claim 7, wherein the back-up power mechanism provides the back-up power when the movable container executes a loading or unloading operation.

9. The movable container of claim 7, wherein the back-up power mechanism provides the back-up power when the movable container requires a momentum stronger than that provided by the driving mechanism.

10. The movable container of claim 7, wherein the back-up power mechanism comprises:
    an energy storing device, wherein the energy storing device is charged by the current when the movable container stays in an idle state.

11. The movable container of claim 7, wherein the back-up power mechanism comprises:

an energy storing device, wherein the energy storing device is charged by the current when the momentum of the movable container is smaller than a predetermined value.

12. The movable container of claim 7, wherein the momentum is provided in accordance with the driving power.

13. The movable container of claim 12, wherein the back-up power mechanism provides the back-up power when the driving power is lower than a predetermined value.

14. The movable container of claim 12, wherein the back-up power mechanism comprising:
an energy storing device, wherein the energy storing device is charged by the current when the driving power reaches a predetermined value.

15. A transport method, comprising:
sending a quantity information indicative of a quantity of vehicles in a zone;
sending an output signal in accordance with the quantity information;
adjusting a current in accordance with the output signal; and
outputting the adjusted current to a cable extending through the zone.

16. The transport method of claim 15, further comprising:
stopping outputting the adjusted current when the output signal indicates that no vehicle is in the zone.

17. The transport method of claim 15, wherein the current and the quantity of vehicles in the zone are positively correlated.

18. The transport method of claim 15, wherein the quantity information and the output signal are sent through Wireless Fidelity (Wi-Fi).

19. The transport method of claim 15, further comprising:
providing a momentum toward a movable container; and
providing a back-up power to the movable container when a back-up condition is fit.

20. The transport method of claim 15, wherein providing the back-up power comprises:
providing the back-up power when a loading or unloading operation is being executed.

* * * * *